United States Patent [19]

Murakami et al.

[11] Patent Number: 5,126,815
[45] Date of Patent: Jun. 30, 1992

[54] POSITION SENSOR AND PICTURE IMAGE INPUT DEVICE

[75] Inventors: Satoru Murakami, Kobe; Minori Yamaguchi, Akashi; Akimine Hayashi, Kobe; Masataka Konda, Kobe; Yoshihisa Tawada, Kobe, all of Japan

[73] Assignee: Kanegafuchi Chemical Industry Co., Ltd., Osaka, Japan

[21] Appl. No.: 609,284

[22] Filed: Nov. 5, 1990

Related U.S. Application Data

[62] Division of Ser. No. 320,149, Mar. 7, 1989, Pat. No. 5,025,297.

[30] Foreign Application Priority Data

Mar. 7, 1988 [JP] Japan .................. 63-53032

[51] Int. Cl.⁵ .................. H01L 27/14
[52] U.S. Cl. .................. 357/30; 357/19; 357/58; 250/206.1; 330/59; 330/69; 330/260
[58] Field of Search .......... 357/30 P, 30 G, 30 K, 357/30 H, 30 S, 19, 58; 330/59, 69, 259, 260, 291; 250/354.1, 206.1, 206.2, 206.3

[56] References Cited

U.S. PATENT DOCUMENTS

| 4,622,502 | 11/1986 | Maruo et al. | 250/206.1 X |
| 4,792,997 | 12/1988 | Toussaint et al. | 330/59 X |
| 4,841,138 | 6/1989 | Muro | 250/206.1 |
| 4,982,078 | 1/1991 | Ekstano | 250/206.1 |
| 4,987,293 | 1/1991 | Baciak | 250/206.1 |
| 5,049,735 | 9/1991 | Kitajima et al. | 250/206.1 |

FOREIGN PATENT DOCUMENTS

| 59-50579 | 3/1984 | Japan |  |
| 60-32486 | 2/1985 | Japan | 357/30.5 |
| 60-120555 | 6/1985 | Japan | 357/30.5 |
| 60-120556 | 6/1985 | Japan | 357/30.5 |
| 1-258188 | 10/1989 | Japan | 330/291 |

OTHER PUBLICATIONS

Shidler, "Noise Immune-High-Gain Photodiode Amplifier," *IBM Technical Disclosure Bulletin* vol. 15, No. 5 (Oct. '72) 1505-6.

Wendland et al., "Detectors: Inexpensive P-I-N Photodiodes Match Fiber, Source Characteristics," *Electronics.* Aug. 5, 1976, 101-2.

*Primary Examiner*—William Mintel
*Attorney, Agent, or Firm*—Jordan and Hamburg

[57] ABSTRACT

A semiconductor light beam position sensor element comprises a semiconductor layer of successively formed p-, i- and n-type semiconductor layers and an electrically conductive layer on either side of the semiconductive layer. At least one of the conductive layers is made of a transparent material, and at least the other conductive layer and the semiconductor layer are provided with a plurality of common apertures extending in the thickness direction. At least one of the conductor layers is provided with one or two pairs of electrodes of opposite polarity and positioned in its marginal regions. The sensor element is light transparent. A feedback circuit is provided to insure that the incident light is constant.

10 Claims, 12 Drawing Sheets

POSITION SENSOR AND PICTURE IMAGE INPUT DEVICE

This is a division of application Ser. No. 07/320,149, filed Mar. 7, 1989 now U.S. Pat. No. 5,025,297.

BACKGROUND OF THE INVENTION

1. Technical Field

This invention relates to a semiconductor light beam position sensor element and a position sensor and a picture image input device each using the same.

2. Background Technology

Japanese Patent Application KOKAI 50579/1984 discloses a semiconductor light beam position sensor element comprising a semiconductor layer composed of p-, i- and n-type semiconductors successively formed and a light-transparent electrically conductive layer disposed on either side of said semiconductor layer, said light-transparent electrically conductive layers having at least one pair of electrodes disposed in juxtaposition.

A light beam incident, at one point, on one of the transparent conductive layers of such a semiconductor light beam position sensor element passes through the particular transparent conductive layer to its semiconductor layer. In the semiconductor layer, the incidence of the light beam gives rise to electron-hole pairs within the i-type amorphous semiconductor and, of such a pair, the electron diffuses into the n-type amorphous semiconductor while the positive hole moves into the p-type amorphous semiconductor. As a result, an electromotive force is generated between the two transparent conductive layers. Therefore, when an ammeter is externally connected to each of the electrodes, the current derived from the electrodes can be measured. Since the current values thus measured are dependent on the distance between the point of incidence of the light beam and the respective electrodes, the point of incidence of the light beam can be found from the measured current values.

Since the conventional semiconductor light beam position sensor element described above employs amorphous semiconductors, the position sensor element with a large area can be easily obtained. But the light transparency of the whole element cannot be realized because of the low clarity of the semiconductor layer. Therefore, the semiconductor light beam position sensor element is limited in the range of application.

Having been accomplished to overcome the above disadvantage, this invention has, as its object, to provide a transparent semiconductor light beam position sensor element and a position sensor and a picture image input device utilizing the same.

SUMMARY OF THE INVENTION

The semiconductor light beam position sensor element of this invention is characterized in that it comprises a semiconductor layer consisting of p- i-and n-type semiconductor layers successively formed and a conductive layer disposed on either side of said semiconductive layer, at least one of the conductive layers being made of a transparent material, at least the other conductive layer and said semiconductor layer being provided with a multiplicity of common apertures or minute through-holes running in the thickness direction and at least one conductive layer being provided with one pair or two pairs of electrodes of opposite polarities as disposed in a marginal region thereof. Thus, the semiconductor light beam position sensor element of this invention is such that, of the conductive layers disposed on opposing sides of the semiconductive layer, the conductive layer on the light incidence side is a transparent layer while the conductive layer on the side opposite to the light incidence side and the semiconductor layer are provided with a multiplicity of common apertures, and one or both of the two conductive layers are provided with one pair or two pairs of electrodes of opposed polarities in a marginal region thereof. Though the semiconductor layer is either translucent or opaque, it is endowed with light transparency by said multiplicity of minute apertures. Of the conductive layers disposed on opposing sides of the semiconductive layer, the conductive layer on the light incidence side must be transparent in order that the light to be transmitted to the semiconductor layer will not be intercepted but the conductive layer on the opposite side need not be transparent.

When the conductive layer on the side opposite to the light incidence side is not a transparent layer, the non-transparent conductive layer must be provided with minute apertures respectively aligned with those in the semiconductive layer for assurance of light transmission and prevention of short circuiting between the two conductive layers. Moreover, even when the conductive layer on the side opposite to the light incidence side is a transparent layer, it should be provided with apertures for prevention of short circuiting between the two conductive layers. However, the conductive layer on the light incidence side, which is transparent, need not be provided with apertures.

For biaxial light beam position detection, the position sensor element must be provided with two pairs of electrodes of opposite polarities as a whole. In this case, both electrode pairs may be disposed in the conductive layer on the light incidence side or in the conductive layer on the opposite side. Alternatively, each conductive layer may be provided with one pair of electrodes. For monoaxial light beam position detection, it is sufficient to provide only one pair of electrodes of opposed polarities per element and this pair of electrodes may be disposed in whichever of the two conductive layers. In all of these instances, the conductive layer provided with such pair or pairs of electrodes should have an appropriate electrical resistance and such electrodes of opposed polarities can be disposed in whichever of the transparent conductive layer and the non-transparent conductive layer.

Because of the above-described structural features that the conductive layer on the light incidence side is made of a transparent material, that the translucent or opaque semiconductive layer is provided with a multiplicity of minute apertures and that the conductive layer on the side opposite to the light incidence side has the corresponding minute apertures, the incident light passes through these minute apertures and the transparent conductive layer without regard to the clarity of the material constituting the conductive layer on the side opposite to the light incidence side. Therefore, the transmissivity to light of the whole semiconductor light beam position sensor element is realized, and to the person who uses it, the sensor element appears as if it were constituted by transparent materials throughout.

The positioning light beam incident, at one point, on the conductive layer made of a transparent material passes through the layer and reaches the semiconductor layer. In the semiconductor layer, the incidence of light gives rise to electron-hole pairs within the i-type semiconductor and of each of such pairs, the electron diffuses into the n-type semiconductor while the positive hole move to the p-type semiconductor layer. As a result, an electromotive force is generated between the p-type semiconductor and n-type semiconductor. In this situation, since at least the conductive layer on the side opposite to the light incidence side and the semiconductor layer have common apertures, there occurs no short circuiting between the two conductive layers. Therefore, in providing each conductive layer with electrodes of opposed polarities, each electrode is externally connected to one terminal of an ammeter, with the other terminals of respective ammeters are connected to each other. In the case where only one of the conductive layers is provided with electrodes of opposed polarities, an ammeter is externally interposed between each of the electrodes and the other conductive layer. In both cases, a current flows through each ammeter. Since the distance between the point of incidence of the light beam and the electrode is determinative of the resistance value of the conductive layer therebetween, the point of light incidence can be found from the measured current values.

As explained above, the semiconductor light beam position sensor element of this invention realizes the transmissivity of the whole element to light without causing a short-circuit between the two conductive layers. Furthermore, by allowing a positioning light beam to be incident, at a point, on the transparent conductive layer and measuring the currents using one pair or two pairs of electrodes of opposed polarities disposed in the marginal region of at least one of the conductive layers by utilizing the photoelectromotive effect of the semiconductor layer, the position of the incidence of the light beam can be ascertained. Therefore, this element can be used with advantage in a position sensor or picture image input device for the purpose of inputting a figure drawn, for example on a sheet of paper, into a computer.

The semiconductor layer of the above-described semiconductor light beam position sensor element can be constituted by using crystalline semiconductor or amorphous semiconductor materials. The use of amorphous semiconductors for the semiconductor layer provides a position sensor element which is inexpensive and has a high energy conversion efficiency. The adoption of a hetero-junction structure in which at least the light-receiving side of the semiconductor layer is made of amorphous silicon carbide leads to a semiconductor optical position sensor element with a particularly high energy conversion efficiency. The transparent conductive layer is preferably constituted by an ITO film as thin as about 100 to 2000 Å. Each of said minute apertures is preferably rectangular, about 100 $\mu$m square in section, and arranged in the fashion of a grating with an area ratio of apertured area to non-apertured area of about 1:1.

The semiconductor light beam position sensor element of the position sensor according to this invention has a semiconductor layer composed of p-, i-and n-type semiconductors successively formed and provided with electrodes on both sides thereof, with at least the electrodes on one side being electrodes of opposite polarities. The position sensor of this invention comprises the above semiconductor light beam position sensor element, a light source capable of varying the position of incidence of light on the position sensor element and a means for detecting the level of light incident on the element and holding the level constant. Since, in this position sensor, the level of light on the semiconductor light beam position sensor element is kept constant by feedback control, the sum of currents derived from said pair of electrodes of opposed polarities is constant so that the point of incidence of light can be identified from the output from one electrode of the pair. Therefore, it is not necessary to provide a complicated circuit such as a divider, thus contributing to circuit simplicity.

The light level detecting and holding means can be constituted by an adder for summing the photocurrent outputs from the respective electrodes of the electrode pair and a feedback circuit which, based on this output from the adder, acts on the light source so as to keep constant the quantity of light incident on the semiconductor light beam position sensor element. There may also be provided a comparator means for checking whether the amount of operation of the feedback circuit is within a predetermined range and judging whether the light beam from said light source is properly incident on said semiconductor light beam position sensor element.

The semiconductor light beam position sensor element of the picture image input device according to this invention includes a semiconductor layer composed of p-, i- and n-type semiconductors in succession and provided with electrodes on both sides, with at the least the electrode on one side being a pair of electrodes of opposite polarities. The picture image input device of this invention comprises the above semiconductor light beam position sensor element, a light source which is variable in irradiating position with respect to said position sensor element, a means for detecting and holding constant the quantity of light incident on said position sensor element, a means for outputting a position signal, which represents the position of incidence of light on the position sensor element, according to the photo-current outputs derived from the electrodes of opposed polarities and a means for outputting a dark-bright signal, which represents the intensity of light incident on the position sensor element after passing or being reflected by an original, according to the photocurrent outputs derived from the electrodes of opposed polarities. This picture image input device is a convenient and economical device suited to applications in which the information to be inputted is a part of an original or to applications which do not require a high degree of precision. Furthermore, unlike the conventional device employing a solid image pickup element such as CCD, the device of this invention does not require lens optics for size reduction of the object image to be inputted. Moreover, since the quantity of light incident on the semiconductor light beam position sensor element is maintained at a constant level by feedback control, image input can be made according to the output from only one electrode of the electrode pair so that the circuitry is simplified.

The position signal output menas can be constituted by using an amplifier adapted to amplify the photocurrent derived from one electrode of the electrode pair. The bright-dark signal output means can be constituted by using an adder adapted to output the sum of photocurrent outputs derived from the respective electrodes of the electrode pair and a comparator adapted to compare the output from said adder with a predetermined value. Additionally, there may also be provided a synthetic signal generating means comprising a delay circuit for delaying the position signal and a sample-hold circuit adapted to sample the output from said delay circuit at the variation timing of the bright-dark signal and hold it. Instead of the above signal synthesizer, there may be provided a synthetic signal generating means consisting of an A/D conversion means for analog-digital conversion of the position signal, a memory means for storing the data outputted by the A/D converter during a predetermined time period, and a control means for designating a given data from among the output data stored in said memory means as a picture image signal according to the variation timing of the bright-dark signal. Furthermore, still better defined picture information will be obtained if there is additionally provided noise eliminating means adapted to remove the noise from the photocurrents derived from the respective electrodes of the electrode pair.

DESCRIPTION OF THE PREFERRED EMBODIMENTS

This invention will be described in further detail hereinafter with reference to the accompanying drawings.

Figure 1:
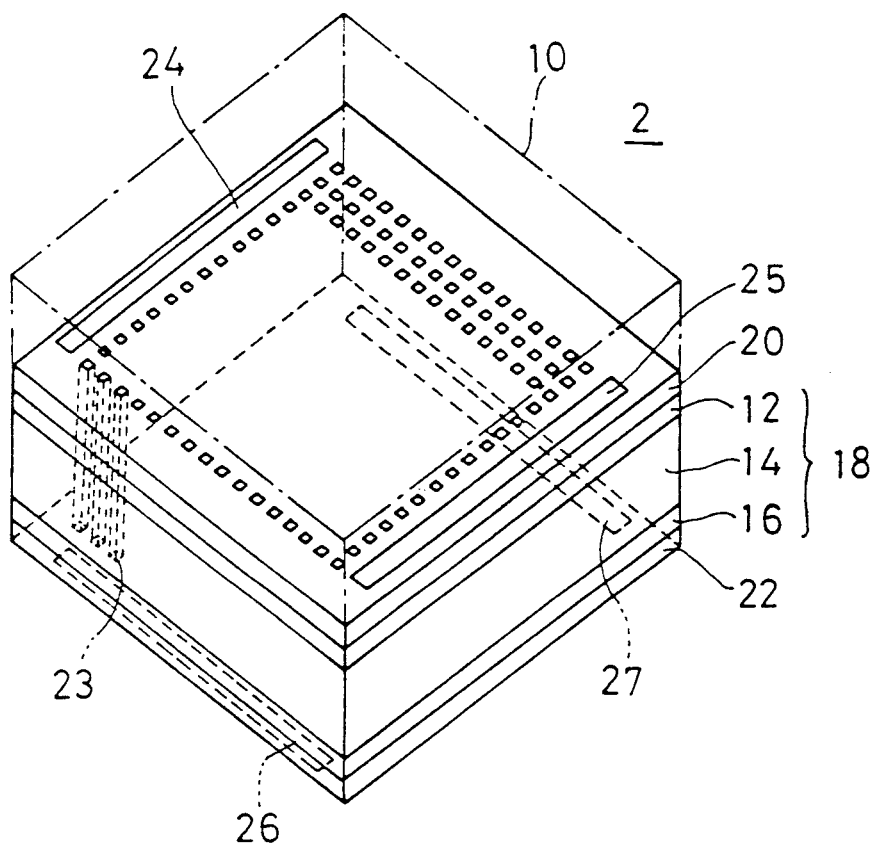
FIG. 1 is a perspective view showing a two-dimensional semiconductor light beam position sensor element according to an embodiment of this invention.

FIG. 1 is a perspective view showing the two-dimensional semiconductor light beam position sensor element according to an embodiment of this invention.

The semiconductor light beam position sensor element, designated at 2, comprises a rectangular glass substrate 10, a transparent electrically conductive layer 20 formed thereon by vacuum evaporation, a semiconductor layer 18 superposed thereon, and another transparent conductive layer 22 formed further thereon by vacuum evaporation. In detail, the semiconductor layer 18 comprises a p-type semiconductor 12, an i-type semiconductor 14 and an 1-type semiconductor 16 as bonded in the order mentioned. The two transparent electrically conductive layers 20, 22 and semiconductor layer 18 are respectively provided with a multiplicity of common apertures 23 respectively aligned in the thickness direction thereof in the fashion of a grating. The transparent electrically conductive layer 20 closer to a glass substrate 10 is provided with a pair of parallel linear bands of electrodes 24, 25 along opposing two side edges. The other transparent conductive layer 22 is also provided with a pair of parallel linear bands of electrodes 26, 27 along opposing two sides and at right angles with the first mentioned pair of linear electrodes.

The transparent electrically conductive layers 20, 22 can be constituted by a transparent film of metal oxide such as indium oxide, tin oxide, zinc oxide and the like. The thickness of the transparent electrically conductive layers 20.22 is preferably in the range of about 100 to 2000Å. If the electrically conductive layer is thinner than about 100 Å, the local variation in thickness tends to cause an error of measured current value, while the film resistance will be too small if the thickness of the conductive layer is over about 2000 Å. However, the thickness may be larger when a material having a larger resistivity is employed. Furthermore, said transparent electrically conductive layers 20, 22 may be those constituted by thin films of metals such as aluminum, chromium, nickel, molybdenum, nickel-chrome or the like which have a thickness of about 50 Å. Films of these metals are transparent up to this thickness value and assures a uniform resistance distribution.

Of the semiconductor layer 18, the i-type semiconductor 14 can be constituted from amorphous semiconductor materials such as amorphous silicon (a-Si:H), amorphous silicon carbide (a-SiC:H), amorphous germanium (a-Ge:H), amorphous silicon nitride (a-SiN:H), amorphous silicon germanium (a-SiGe:H), amorphous silicon fluoride (a-SiF:H) and so on. The p-type semiconductor 12 and n-type semiconductor 16 can be constituted from materials obtained by adding, for example, boron (B) and phosphorus (P), respectively, as impurities to such materials. The appropriate thicknesses of said p-, i- and n-type semiconductors 12, 14, 16 are approximately 100 to 500 Å, 0.3 to 1 μm, and 50 to 500 Å, respectively. The semiconductor layer may be formed by any of the known techniques such as direct current, intermediate frequency or high frequency plasma CVD, light-excited CVD, thermal CVD and sputtering. For example, the formation of an a-Si:H semiconductor 18 by CVD can be performed using silane (SiH$_4$) gas and, as impurity gases, diborane (B$_2$H$_6$) gas and phosphine (PH$_3$) gas. Thus, when a semiconductor layer 18 is formed from amorphous semiconductor materials, there can be obtained a position sensor element 2 which is inexpensive and high in energy conversion efficiency. When a hetero-junction structure using a p-type semiconductor film of a-SiC:H and i-type and n-type semiconductive films 14, 16 of a-Si:H is employed and the p-type semiconductor film 12 is used as the light-incident side layer, there is obtained an element having a particularly high energy conversion efficiency. Moreover, this semiconductor layer 18 can be constituted by using crystalling semiconductor materials such as silicon single crystals, polycrystals and microfine crystals, for instance. Furthermore, the semiconductor layer 18 may be formed in whichever of the order of p-, i-, and n-type semiconductors and in the order of n-, i- and p-type semiconductors.

Figure 2:
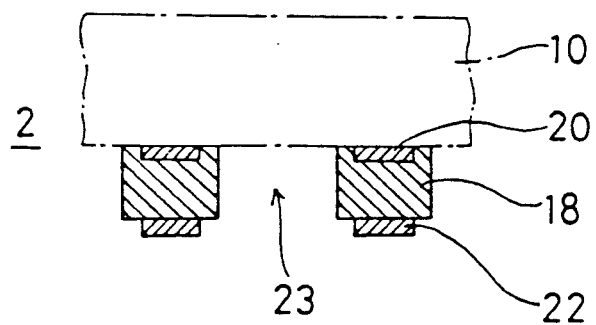
FIG. 2 is a partial end view in longitudinal section of the position sensor element illustrated in FIG. 1.

The common apertures 23 running through the light-transparent electrically conductive layers 20, 22 and semiconductor layer 18 can be formed by an appropriate technique such as photolithography. Because of the presence of these apertures 23, the light is enabled to pass through the minute apertures without attenuation notwithstanding the translucency or opacity of the semiconductor layer 18, with the result that the apparent light transparency of the position sensor element 2 as a whole is assured. FIG. 2 is a partial end view in longitudinal section of the two-dimensional semiconductor light beam position sensor element 2 described above. As shown, when the width of the transparent electrically conductive layers 20, 22 is designed to be smaller than the width of the semiconductor layer 18, the risk of a short circuit between the two transparent electrically conductive layers 20, 22 can be completely eliminated. The cross-sectional size of these minute apertures 23 is preferably about 100 μm square. When the aperture size is of this order, the apertures 23 are hardly recognized by the naked eye and a high apparent transparency of the semiconductor light beam position sensor element 2 can be realized. Increasing the are ratio of apertured area to nonapertured area would increase the apparent transparency of the sensor element but result in a reduction in the photo-electromotive force generated in the semiconductor layer 18. Therefore, the ratio of apertured area to non-apertured area is preferably in the neighborhood of 1:1. However, it is possible to increase the size of each aperture 23 and decrease the density of the apertures 23. As regards the configuration and arrangement of minute apertures 23, rectangular apertures arranged in the fashion of a grating are preferred but, instead, apertures having a circular, elliptical, diamond-shaped, triangular or hexagonal cross-section may be arranged in the form of a grating or in a staggered fashion. Furthermore, the transparent electrically conductive layer 20 closer to the glass substrate 10 need not be provided with such apertures 23. Thus, even if the transparent electrically conductive layer 20 is formed all over the surface of the glass substrate 10, the presence of common minute apertures 23 running through the semiconductor layer 18 and the other transparent electrically conductive layer 22 precludes short circuiting between the two transparent electrically conductive layers 20, 22. Moreover, even if the transparent electrically conductive layer 20 is formed over the whole are, it does not detract from the light transmissivity of the sensor element 2 because of its own transparency.

Figure 3:
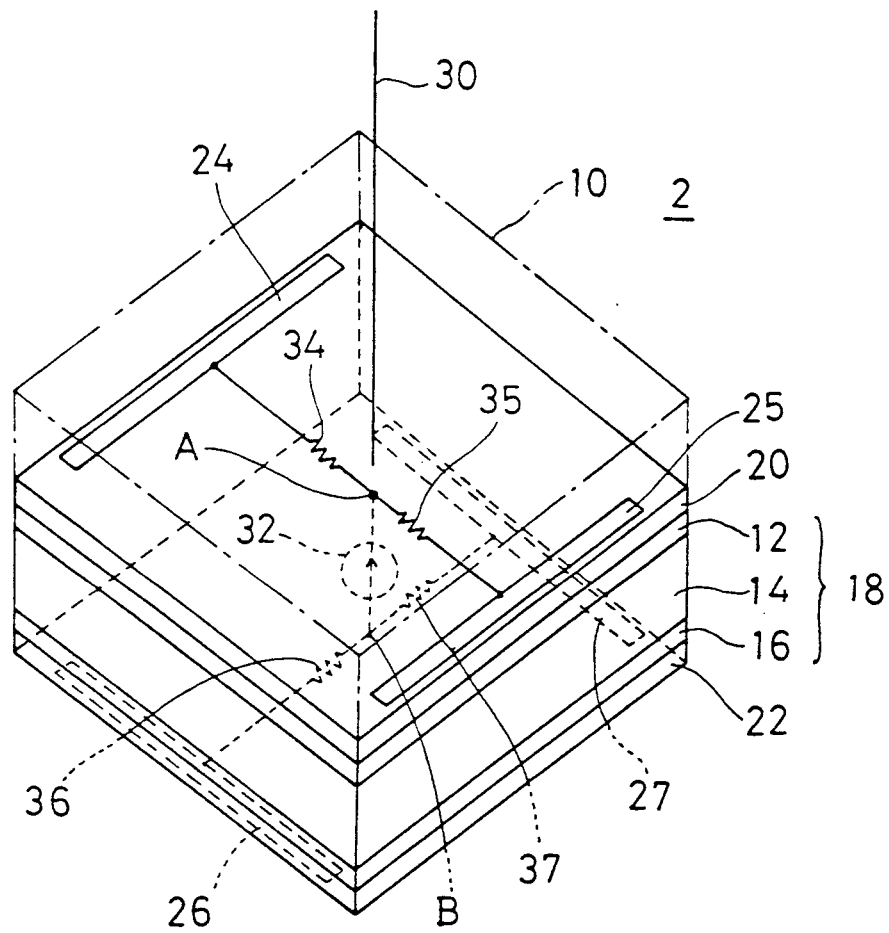
FIG. 3 is a perspective schematic view showing the operation of the position sensor element illustrated in FIG. 1.

Now, the operation of the above-described semiconductor light beam position sensor element 2 will be described with reference to FIG. 3. In FIG. 3, the minute apertures 23 are not represented.

A light beam 30 projected from a light source not shown, such as a light emitting diode (LED), is incident on the semiconductor light beam position sensor element 2 from the glass substrate 10 side. This light beam 30 passes through the glass substrate 10 and transparent electrically conductive layer 20 and is incident on the semiconductor layer 18 at point A. In this semiconductor layer 18, the incident light beam 30 produces a electron-hole pairs within the i-type semiconductor 14 so that an electromotive force is generated between the p-type semiconductor 12 and n-type semiconductor 16. In FIG. 3, this force is represented as a current source 32.

The resistance distribution of the transparent electrically conductive layer 20 is uniform. Therefore, when the distance between electrodes 24 and 25 is taken as $l_1$ and the distance from point A to the electrode 24 as x, the resistance values $R_{34}$ and $R_{35}$ of transparent electrically conductive layer 20 as resistors 34 and 35, respectively, between point A and the respective electrodes 24 and 25 can be written as $x \cdot \rho_1$ and $(l_1 - x) \cdot \rho_1$, where $\rho_1$ is a proportional constant. The resistance distribution of the other transparent electrically conductive layer 22 is also uniform. Therefore, when the point of intersection of an extension of the light beam 30 with the upper surface of the transparent conductive layer 22 disposed under the semiconductor layer 18, that is to say the distance from point B to electrode 26 as shown in FIG. 3, is taken as y and the distance between electrodes 26 and 27 is taken as $l_2$, the resistance values $R_{36}$ and $R_{37}$ of semiconductor layer 22 as resistors 36 and 37 between point B and the respective electrodes 24 and 25 can be written as $y \cdot \rho_2$ and $(l_2 - y) \cdot \rho_2$, where $\rho_2$ is a proportional constant.

Figure 4:
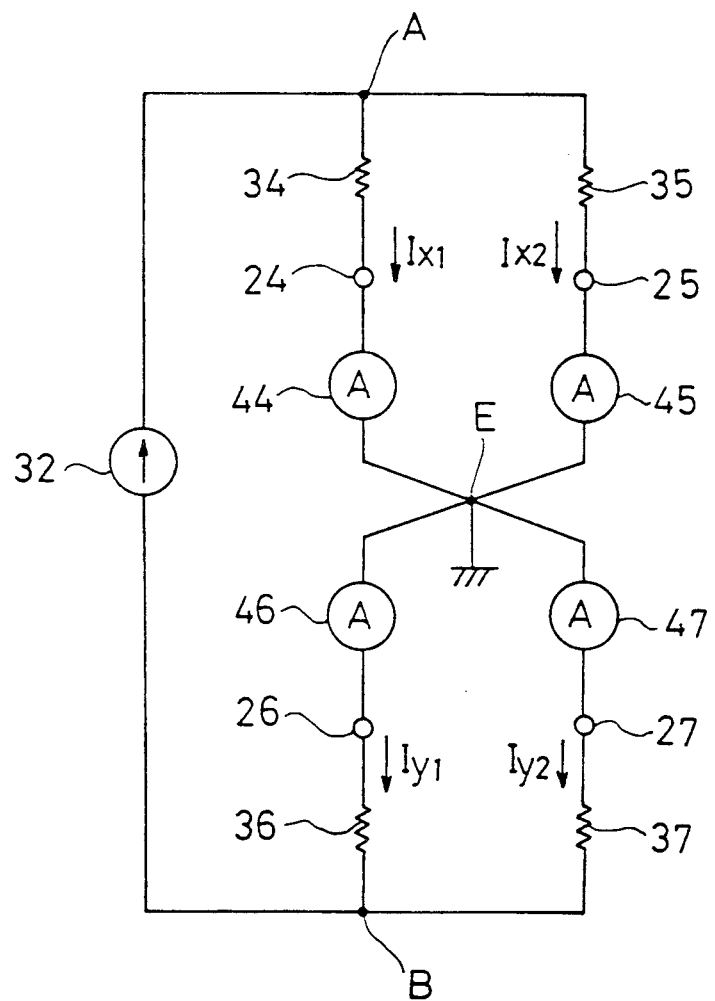
FIG. 4 is an equivalent circuit diagram showing the condition where ammeters are connected to the position sensor element illustrated in FIG. 1.

FIG. 4 is an equivalent circuit diagram of the condition in which ammeters have been connected to the above-described semiconductor light beam position sensor element 2.

The two pairs of electrodes 24, 25 and 26, 27 are electrically connected, externally of the semiconductor light beam position sensor element 2, for example to a common point E through ammeters 44, 45 and 46, 47, respectively. In this case, when the currents which flow through the respective ammeters 44, 45, 46, 47 are taken as I $x_1$, I $x_2$, I $y_1$ and I $y_2$, respectively, there hold the following equations (1) and (2).

$$R_{34} \cdot I\, x_1 = R_{35} \cdot I\, x_2 \tag{1}$$

$$R_{36} \cdot I\, y_1 = R_{37} \cdot I\, y_2 \tag{2}$$

Substituting the above-mentioned expressions as resistance values $R_{34}$, $R_{35}$, $R_{36}$ and $R_{37}$ in these equations give the following expressions.

$$x \cdot \rho_1 \cdot I\, x_1 = (l_1 - x) \cdot \rho_1 \cdot I\, x_2 \tag{3}$$

$$y \cdot \rho_2 \cdot I\, y_1 = (l_2 - y) \cdot \rho_2 \cdot I\, y_2 \tag{4}$$

Therefore, the values of x and y are given by the following equations (5) and (6) and, hence, the position of incidence of the light beam can be found from the known values $l_1$ and $l_2$ and measured current values $I x_1$, $I x_2$, $I y_1$ and $I y_2$.

$$x = l_1 \cdot I x_2/(I x_1 - I x_2) \quad (5)$$

$$y = l_2 \cdot I y_2/(I y_1 - I y_2) \quad (6)$$

To input a figure drawn on a sheet of paper, for instance, into a computer utilizing the above-described semiconductor light beam position sensor element 2 which is light-transparent, this position sensor element 2 is placed on the sheet of paper and the light source is moved, with the contour line of the figure being monitored through the position sensor element 2, so as to shift the point of incidence of the light beam along the contour line. The values $l_1$ and $l_2$ are previously inputted to the computer. Then, as the respective current values $I x_1$, $I x_2$, $I y_1$ and $I y_2$ are sequentially inputted to the computer, the coordinates x and y of each point on the figure are sequentially determined by the computer.

In the above embodiment, two pairs of electrodes 24, 25; 26, 27 are used for generating the two-dimensional coordinates of the point of incidence of the light beam. However, it is sufficient to use one pair of electrodes 24, 25 or 26, 27 where only the position of incidence along one axis must be found. Furthermore, the configuration of respective electrodes 24, 25; 26, 27 is not limited to that described hereinbefore and all that is required is to dispose them in opposing relationship along the side edges of the element.

Figure 5:
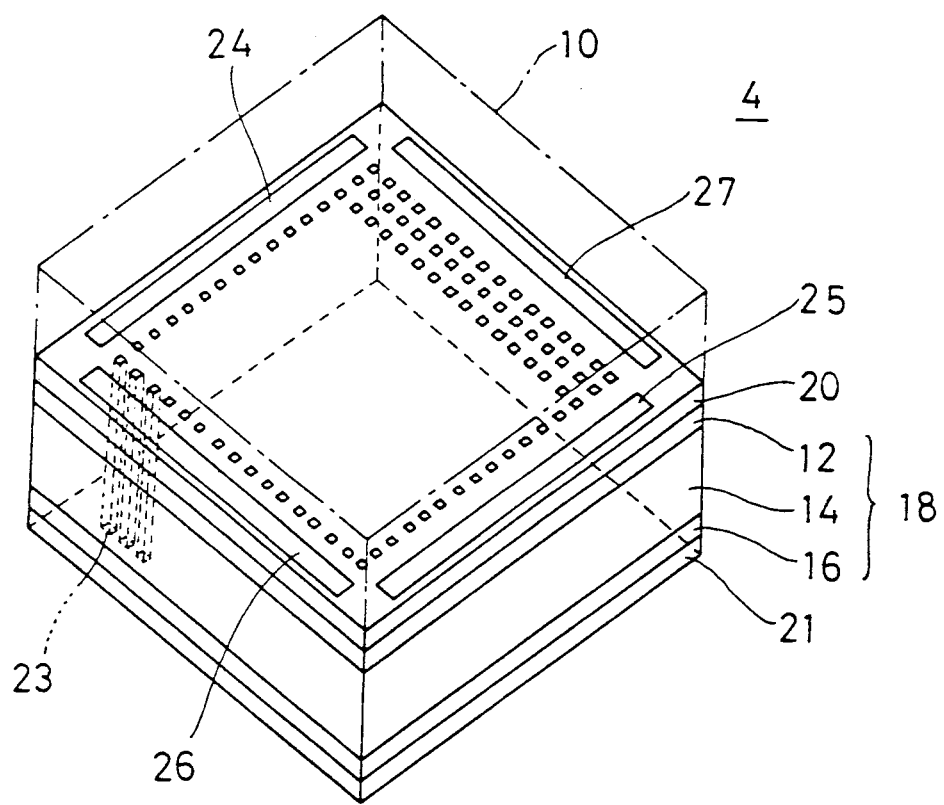
FIG. 5 is a perspective view showing a two dimensional semiconductor light beam position sensor element according to another embodiment of this invention.

FIG. 5 is a perspective view showing a two-dimensional light beam position sensor element according to another embodiment of this invention.

Unlike the position sensor element 2 described hereinbefore, this semiconductor light beam position sensor element 4 comprises an opaque or translucent electrically conductive layer 21 (hereinafter referred to briefly as opaque conductive layer) in lieu of the transparent conductive layer 22 on the side opposite to the light incidence side. This opaque conductive layer 21 is, for example, an opaque metal film and designed to have an increased thickness to give a low resistance so that it can be used as a common electrode. The semiconductor layer 18 and opaque conductive layer 21 are provided with a multiplicity of common minute apertures 23 running in the thickness direction thereof just as described hereinbefore. The electrodes of opposed polarities 26, 27 are not disposed in the opaque conductive layer 21 but are disposed in mutually parallel relationship in two opposing side margins of the transparent conductive layer 20 at right angles with said parallel electrodes 24, 25. The other details of the construction are similar to the corresponding details of the semiconductor light beam position sensor element 2 described hereinbefore and are, therefore, not described.

In this semiconductor light beam position sensor element 4, the semiconductor layer 18 and opaque conductive layer 21 are either translucent or opaque but because of a multiplicity of minute apertures running through the two layers 18, 21 in alignment, the semiconductor layer 18 and opaque conductive layer 21 appear to be transparent and the risk of short circuiting between the transparent conductive layer 20 and the opaque conductive layer 21 is precluded. For the same reason as mentioned hereinbefore, the transparent conductive layer 20 need not be provided with minute apertures 23 but such apertures may be formed in common with those in the other layers.

Now, the operation of the semiconductor light beam position sensor element 4 described above is explained below with reference to FIG. 6. The minute apertures 23 are not represented in FIG. 6, either.

Figure 6:
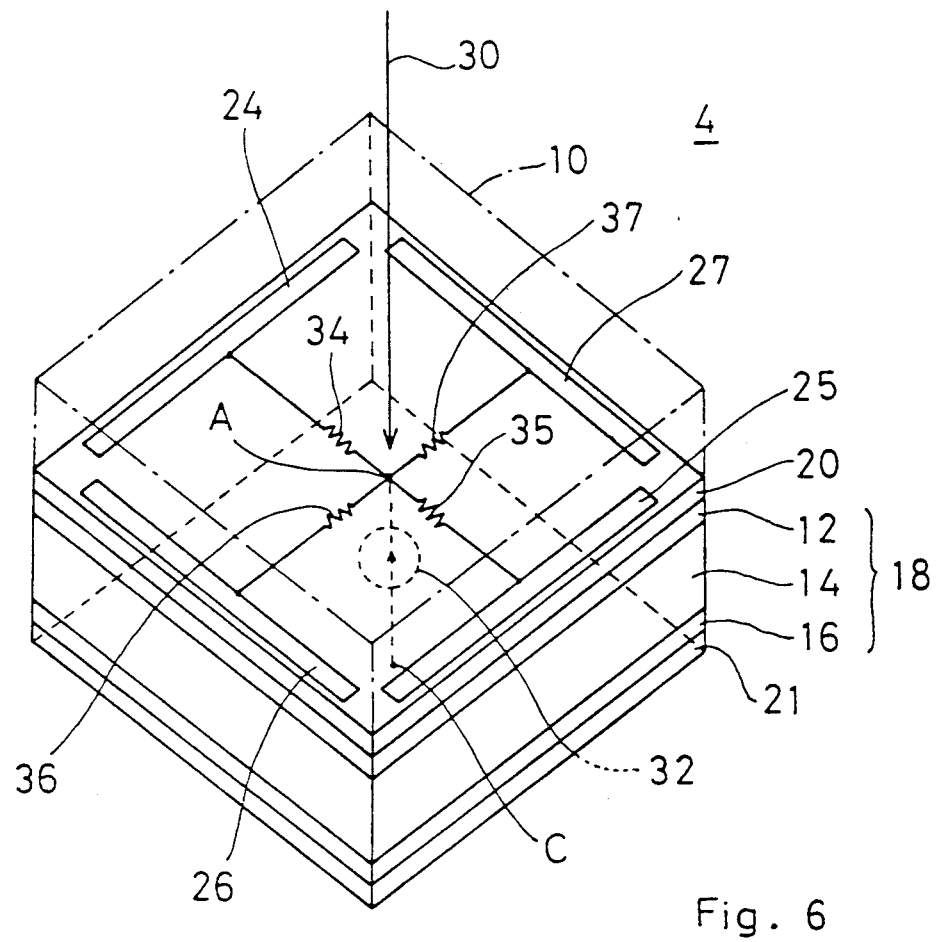
FIG. 6 is a perspective schematic view showing the operation of the position sensor element illustrated in FIG. 5.

The light beam 30 passing through the glass substrate 10 and transparent conductive layer 20 in succession induces an electromotive force in the semiconductor layer 18 just as described hereinbefore. In FIG. 6, too, this point is represented by a current source 32. This current source 32 is generated between A, the point of incidence of the light beam on the semiconductor layer 18, and C, the point of intersection of an extension of the light beam 30 with the upper surface of the opaque conductive layer 21.

The distribution of resistance in the transparent conductive layer 20 is uniform. Therefore, when the distance between the electrodes 24 and 25 is taken as $l_1$ and the distance from point A to electrode 24 as x, the resistance values R34, R35 of the transparent conductive layer 20 as resistors 34, 35 between point A and the respective electrodes 24, 25 can be written as $x \cdot \rho_1$ and $(l_1 - x) \cdot \rho_1$, where $\rho_1$ is a porportional constant. When the distance from point A to electrode 26 is taken as y and the distance between electrodes 26 and 27 as $l_2$, the resistance values R36, R37 of the transparent conductive layer 20 as represented by resistors 36, 37 between point A and the respective electrodes 24, 25 can be written as $y \cdot \rho_1$ and $(l_2 - y) \cdot \rho_1$, where $\rho_1$ is a proportional constant.

Figure 7:
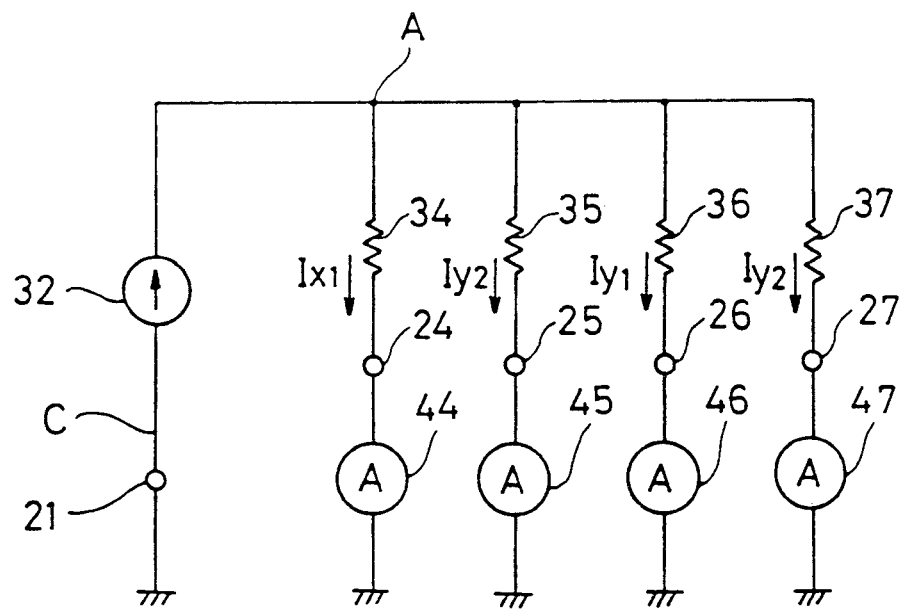
FIG. 7 is an equivalent circuit diagram showing the condition where ammeters are connected to the position sensor element illustrated in FIG. 5.

FIG. 7 is an equivalent circuit diagram of the condition in which ammeters have been connected to the semiconductor light beam position sensor element 4 described above.

The two pairs of electrodes 24, 25; 26, 27 are respectively connected to the opaque conductive layer 21, which serves as a common electrode, for example through ammeters 44, 45; 46, 47 externally of the semiconductor light beam position sensor element 4. When the currents which flow through the ammeters 44, 45, 46, 47 are written as $I x_1$, $I x_2$, $I y_1$ and $I y_2$, respectively, the following equation holds.

$$R_{34} \cdot I x_1 = R_{35} \cdot I x_2 = R_{36} \cdot I y_1 = R_{37} \cdot I y_2 \quad (7)$$

Substituting the above-mentioned expressions for R34, R35, R36 and R37 in this equation (7) and solving the equation give the same formulas (5) and (6) shown hereinbefore. Therefore, from the known values $l_1$ and $l_2$ and the measured current values $I x_1$, $I x_2$, $I y_1$ and $I y_2$, the position of light incidence can be determined as described hereinbefore. Thus, the described light-transmitting semiconductor light beam position sensor element 4 can also be used for the purpose of inputting drawn figures into a computer. When it is only necessary to determine the monoaxial position of incidence of the light beam, it is sufficient to provide only one pair of electrodes 24, 25 or 26, 27 just as explained in connection with the preceding embodiment.

The above semiconductor light beam position sensor element 2 having two transparent conductive layers 20, 22 is provided with pairs of electrodes of opposite polarities 24, 25; 26, 27 in the two respective conductive layers, but these two pairs of electrodes 24, 25; 26, 27 may be disposed in one of the transparent conductive layers 20 or 22, irrespective of whether this conductive layer is on the light incidence side or not. In the latter case, the other transparent conductive layer 22 or 20 which does not have the electrodes of opposite polarities may be increased in thickness to reduce its resistance and used as a common electrode. In the semiconductor light beam position sensor element 4 having a transparent conductive layer 20 and an opaque conductive layer 21 as described above, its transparent conductive layer 20 on the light incidence side is provided with two pairs of electrodes of opposite polarities 24, 25; 26, 27. However, these two pairs of electrodes 24, 25; 26, 27 can be disposed in the opaque conductive layer 21 or one of them be disposed in one of the two conductive layers 20, 21 with the other in the other conductive layer. It should be understood that when the opaque conductive layer 21 is provided with two pairs of electrodes of opposite polarities 24, 25; 26, 27, one may constitute the opaque conductive layer 21 using a material having a suitable resistance value and increase the thickness of the transparent conductive layer 20 on the light incidence layer to reduce its resistance value for use as a common electrode. When the transparent conductive layer 20 and opaque conductive layer 21 are respectively provided with one pair of electrodes, 24, 25; 26, 27, a material having an appropriate resistance value is used for the opaque conductive layer 21.

Figure 8:
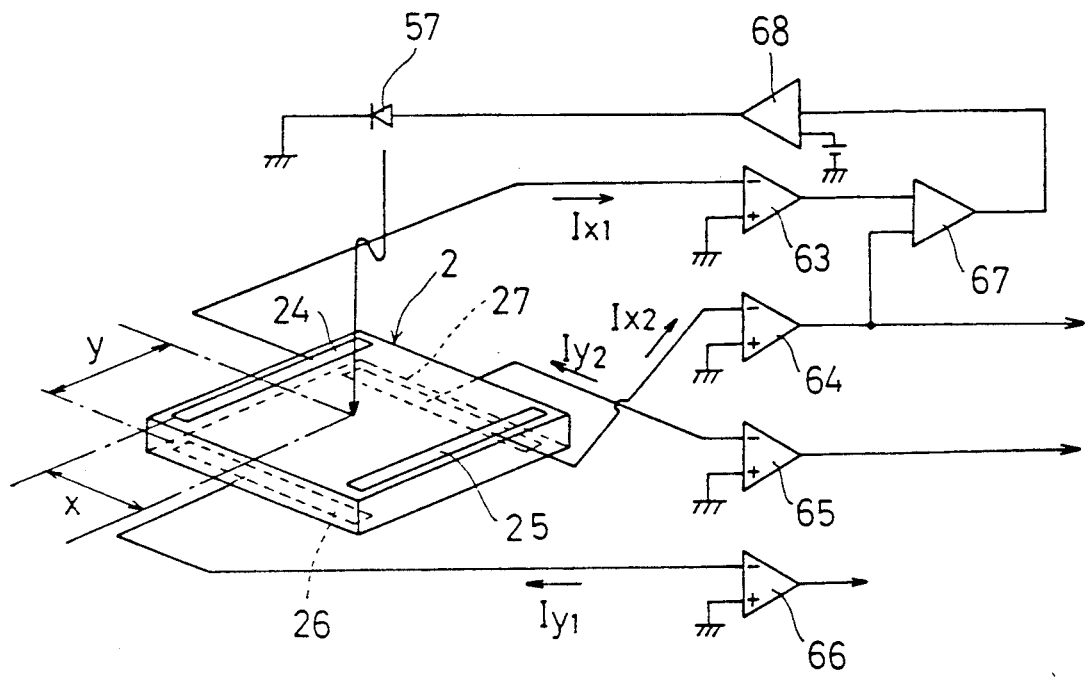
FIG. 8 is a circuit diagram of the position sensor employing the two-dimensional semiconductor light beam position sensor element according to an embodiment of this invention.

FIG. 8 is a circuit diagram of the position sensor using the above-described two-dimentional semiconductor light beam position sensor element 2 in accordance with this invention. However, the glass substrate 10 and minute apertures 23 are not shown.

As a LED 57 is supplied with an electric current, the light beam emitted from the LED 57 is incident on the position sensor element 2 at one point. Thereupon, the currents I x₁, I x₂ flowing from the pair of electrodes of opposite polarities 24, 25 of the position sensor element 2 and the currents I y₁, I y₂ flowing into the other pair of electrodes 26, 27 are respectively amplified in current amplifiers 63, 64, 65, 66. The outputs from current amplifiers 63, 64 are added in an adder-amplifier 67 to give an output voltage proportional to the sum of outputs (I x₁ + I x₂) of the electrodes 24, 25. In this position sensor, feedback control is applied so that the quantity of incident light on the position sensor element 2 will be kept constant by utilizing this output of said adder-amplifier. Thus, a subtractor-amplifier 68 performs a subtraction between the output of said adder-amplifier 67 and a set voltage and the feed current value to LED 57 is corrected according to the result of the above operation. The outputs of current amplifiers 64, 65 are respectively taken out as position signals.

When the distance between LED 57 and position sensor element 2 and the angle of incidence of the light beam from LED 57 are varied, the quantity of light incident on the position sensor element 2 tends to vary. However, since this quantity of light is kept constant by feedback control in this position sensor, the sum of currents (I x₁ + I x₂) derived from the pair of electrodes 24, 25 is constant. Similarly, the sum of currents (I y₁ + I y₂) derived from the other pair of electrodes 26, 27 is also constant. Therefore, the values of x and y relevant to the position of light incidence in equations (5) and (6) are proportional to I x₂ and I y₂, respectively. In this manner, the position of light incidence can be determined from the outputs of current amplifiers 64, 65 alone and, therefore, it is not necessary to execute the division with (I x₁ + I x₂) or (I y₁ + I y₂). The same result is obtained by adding the outputs of current amplifiers 65, 66 using the adder-amplifier 67 and apply the feedback control so as to keep constant the quantity of light incident on the position sensor element 2 based on the output of this adder-amplifier. It is also possible to use, it lieu of position sensor element 2, the element 4 shown in FIG. 5.

Figure 9:
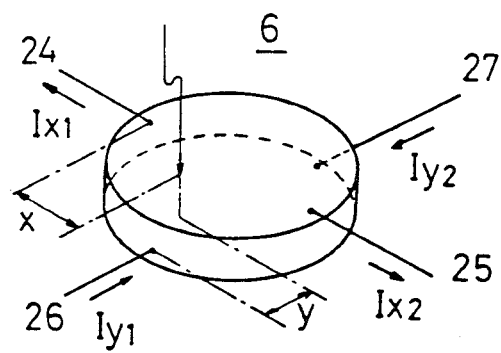
FIG. 9 is a perspective view showing modification of the above two-dimensional semiconductor optical position sensor element.

FIG. 9 is a perspective view illustrating a modification of the two-dimensional semiconductor light beam position sensor element used in the position sensor of this invention. However, as in FIG. 8, the minute apertures are not represented.

This two-dimensional semiconductor light beam position sensor element 6 is configured in the form of a disk and is provided with a pair of dot electrodes 24, 25 on the planar side of its semiconductor layer and another pair of dot electrodes 26, 27 on the opposing planar side. The imaginary line X interconnecting the pair of electrodes 24, 25 intersects the imaginary line Y interconnecting the other pair of electrodes 26, 27 at right angles. By connecting this position sensor element 6 to an external circuit similar to that shown in FIG. 8, there is obtained a position sensor by which the distance x in the X-direction from the point of incidence of the light beam to the electrode 24 and the distance y in the Y-direction from said point of light incidence to the electrode 26 can be determined simply from the current I x₂ flowing out from the electrodre 25 and the current I y₂ flowing into the electrode 27. Therefore, this embodiment does not require a complicated divider. It should be understood that the configuration of the two-dimensional semiconductor light beam position sensor element which can be used in the position sensor of this invention is not limited to the one illustrated but may assume various other forms.

Figure 10:
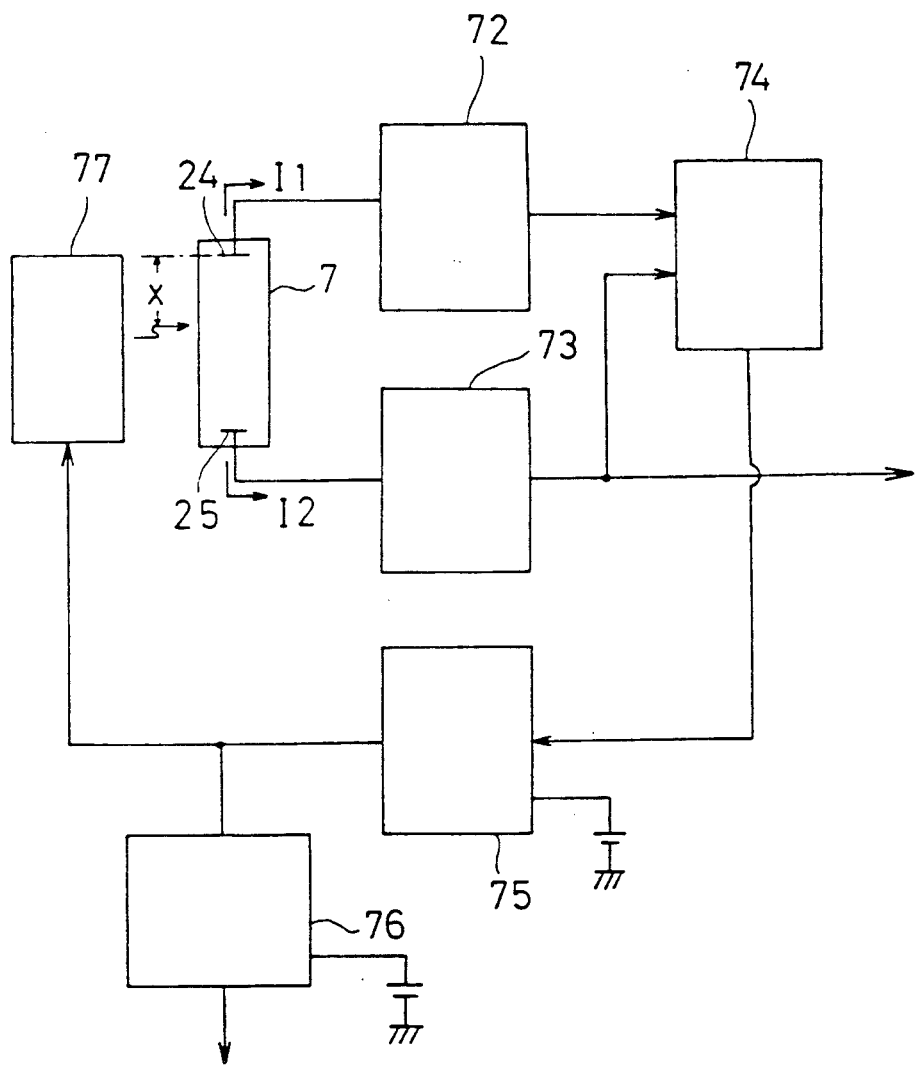
FIg. 10 is a block diagram of the position sensor employing a one-dimensional semiconductor light beam position sensor element according to an embodiment of this invention.
Figure 11:
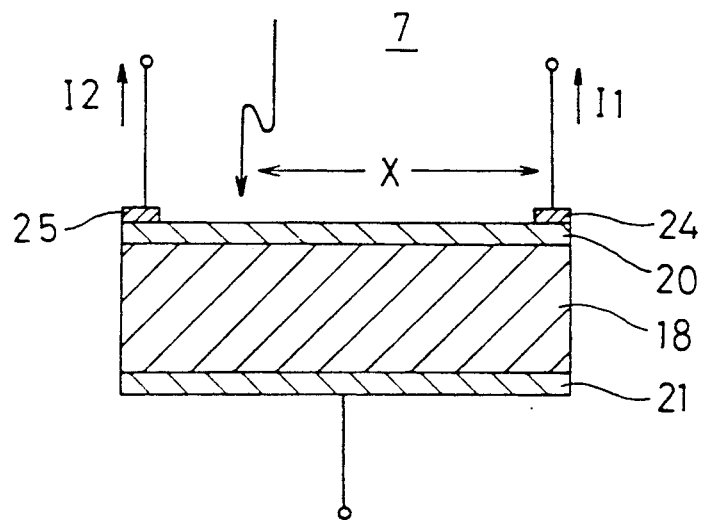
FIG. 11 is a cross-section view showing the position sensor element in the position sensor illustrated in FIG. 10.

FIG. 10 is a block diagram of the position sensor employing the one-dimentional light beam position sensor element in accordance with an embodiment of this invention. An example of the one-dimensional light beam position sensor element used in this position sensor is shown in cross-section in FIG. 11.

The one-dimension semiconductor light beam position sensor 7 is configured in the shape of a bar and, like the two-dimensional element 4 shown in FIG. 5, comprises a semiconductor layer 18, a transparent electrically conductive layer 20 disposed all over the light incidence side of said semiconductor layer 18, and an opaque electrically conductive layer 21 serving as a common electrode as disposed all over the opposing side of said semiconductor layer 18. However, the multiplicity of common minute apertures running through the semiconductor layer 18 and opaque conductive layer 21 are not represented in FIG. 11. On the transparent electrically conductive layer 20, a pair of band-shaped electrodes of opposed polarities 24, 25 are disposed in parallel at the edges opposing in the longitudinal direction of the element.

As shown in FIG. 10, as the light beam emitted from a LED 77 is incident on the element at a point situated at a distance x from the electrode 24, the currents I₁ and I₂ flowing out from the pair of electrodes 24 and 25 are amplified in current amplifiers 72 and 73, respectively. The outputs of these current amplifiers 72 and 27 are summed in an adder-amplifier 74, from which an output voltage proportional to the sum of outputs (I₁+I₂) of the pair of electrodes 24, 25 is obtained. According to this output of the adder-amplifier 74, feedback control is carried out to maintain the quantity of light incident on the position sensor element 7 constant. Thus, the output of said adder-amplifier 74 and a set voltage value are compared in the subtractor-amplifier 75 and the feed current value to LED 77 is corrected according to the result of a subtraction. The output of the current amplifier 73 is taken out as a position signal.

Since, in this position sensor, the quantity of light incident on the position sensor element 7 is kept constant at all times, the sum of currents ($I_1 - I_2$) derived from the pair of electrodes 24, 25 is constant. Therefore, the distance x from the electrode 24 to the point of incidence of the light beam is proportional to $I_2$. Thus, the position of the point of light incidence can be determined from the output of current amplifier 73 alone and, therefore, there is provided a one-dimensional position sensor which does not require a complicated circuit such as a divider. Furthermore, since this embodiment incudes a comparator 76 to which the output of the subtractor and the reference voltage are applied, it is possible to judge whether the light beam from the LED 77 is properly incident on the light-receiving surface of the position sensor element 7 by checking whether the amount of operation of the above-mentioned feedback circuit is within a predetermined range.

Figure 12:
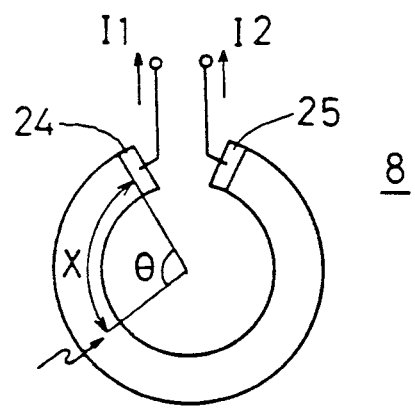
FIG. 12 is a plan view showing a modification of the above one-dimensional semiconductor sensor element.

FIG. 12 is a plan view showing a modification of the one-dimensional semiconductor light beam position sensor element.

This position sensor element 8 is configured in an arcuate form and is provided with a pair of band-shaped electrodes of opposed polarities 24, 25 at the terminal edges in the longitudinal direction of the element. The remainder of the sensor element is identical with that of the one-dimensional semiconductor light beam position sensor element 7 shown in FIG. 11 and, therefore, is not described in detail.

In the case of this one-dimensional semiconductor light beam position sensor element 8, too, by connecting it to an external circuit similar to that shown in FIG. 10, the angle $\theta$ from the position of incidence of the light beam to the electrode 24 can be found merely from the value of current $I_2$ flowing out from the electrode 25. It should be understood that the configuration of this one-dimensional light beam position sensor element is not limited to the one described just above but may assume various other optional forms, e.g. S-, L- and U-shaped.

When the semiconductor light beam position sensor elements 2, 4, 6, 7, 8 to be used in this position sensor need not be light-transparent, the above-described apertures need not be provided. Referring, further, to said semiconductor light beam position sensor elements 2, 4, 6, 7, 8, the electrodes 24, 25; 26, 27 may be directly disposed on the semiconductor layer 18 without provision of transparent electrically conductive layers 20, 22.

The picture image input device of this invention is described below.

Figure 13:
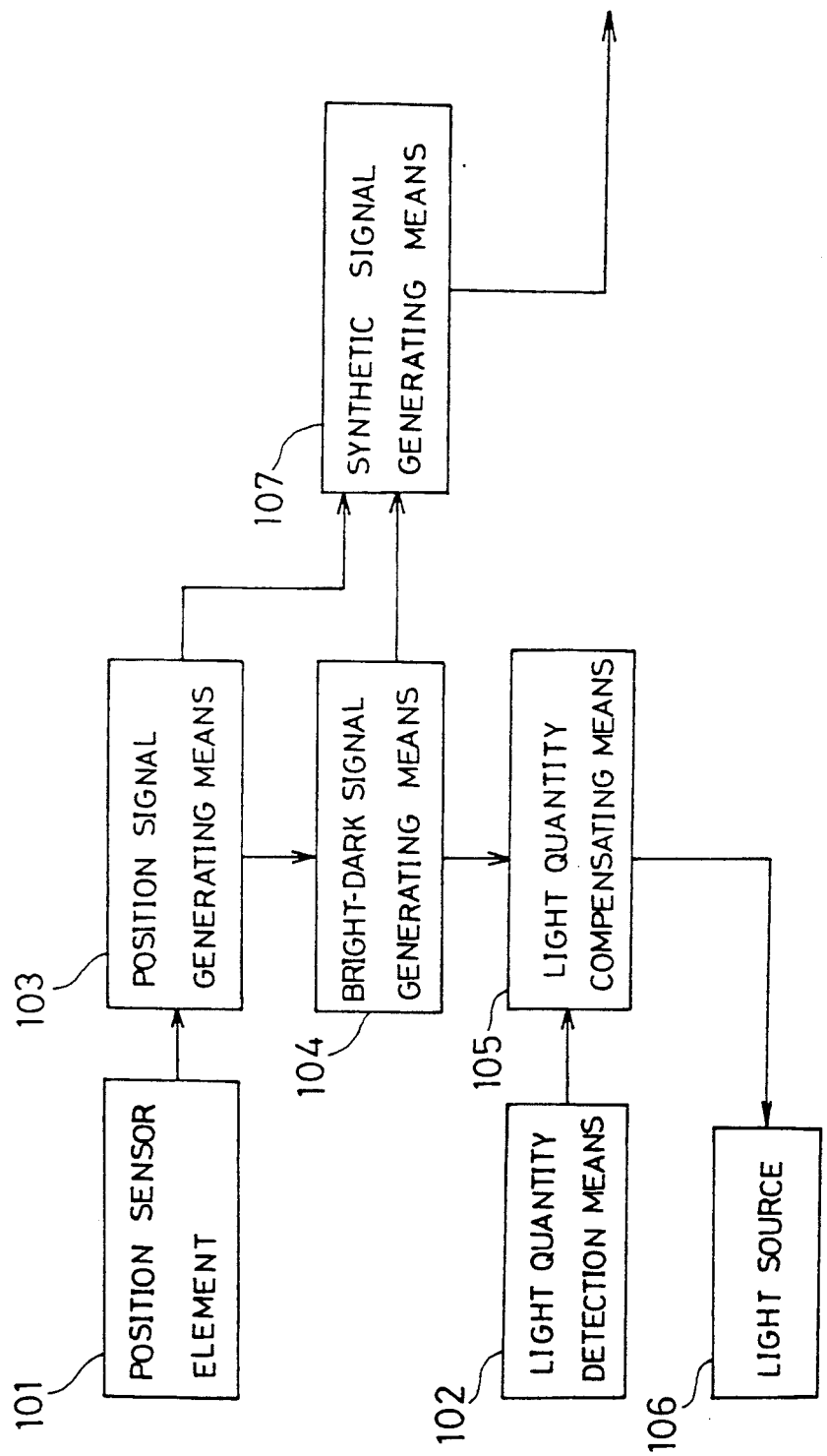
FIG. 13 is a block diagram of a picture image input device according to another embodiment of this invention.

FIG. 13 is a block diagram of the picture image input device according to this invention.

With this picture image input device, as a light beam from a light source 106, which may for example be an LED, is directed to the part of an original to be inputted, which has been positioned in a fixed position relative to a semiconductor light beam position sensor element 101, and the incident position of this beam is moved so as to fill up the minimum area including said part to be inputted, a picture image input signal can be generated. The semiconductor light beam position sensor element 101 has a semiconductor layer made up of p-, i- and n-type semiconductors in successive layers and of the electrodes disposed on both sides of this semiconductor layer, at least the electrode on one side being formed as a pair of electrodes of opposed polarities. The value of the current taken out from the electrode pair not only varies according to the incident position but also varies according to the degree of brightness or darkness of the part of the original to be inputted in that position. A position signal generating means 103 and a bright-dark signal generating means 104 generate a position signal and a bright-dark signal, respectively, according to the current values from the electrodes. The signal output from the picture image input device of thise inveniton is used in a set of position and bright-dark signals according to the demand from a signal receiving means such as a computer. For example, position signals from the dark areas only may fulfill the requirement. In this connection, a synthetic signal generating means 107 is provided as necessary. The variation in the quantity of light incident on the semiconductor light beam position sensor element 101 is constantly monitored by an incident light quantity detection means 102. If a change occurs, a incident light quantity compensating means 105 makes the necessary correction of the movement of the light source 106 so that the quantity of light incident on the semiconductor light beam position sensor element 101 is kept constant. In the absence of a means for controlling the quantity of light incident on the semiconductor light beam position sensor element 101 at a constant level, a variation in the quantity of incident light might inhibits the bright-dark identification function to cause an inaccurate generation of picture image signals. However, the position of said incident light quantity detection means 102 and incident light quantity compensating means 105 eliminates this disadvantage. When an LED is used as said light source 106, the quantity of incident light is controlled so that the variation will be within 20 dB. Instead of using an exclusive element as said incident light quantity detection means 102, it is possible to monitor variations in the quantity of incident light based on the values of currents derived from the electrode pair.

This picture image input device described above is an expedient and economical device, for as an inputter, i.e. a human being, inputs the part of an original of which only a bright-dark discrimination is necessary, a substantial part of the information can be inputted. This device is used in conjunction with a means for receiving picture image input signals, such as a computer, which thereupon easily performs image processing with the aid of software.

Figure 14:
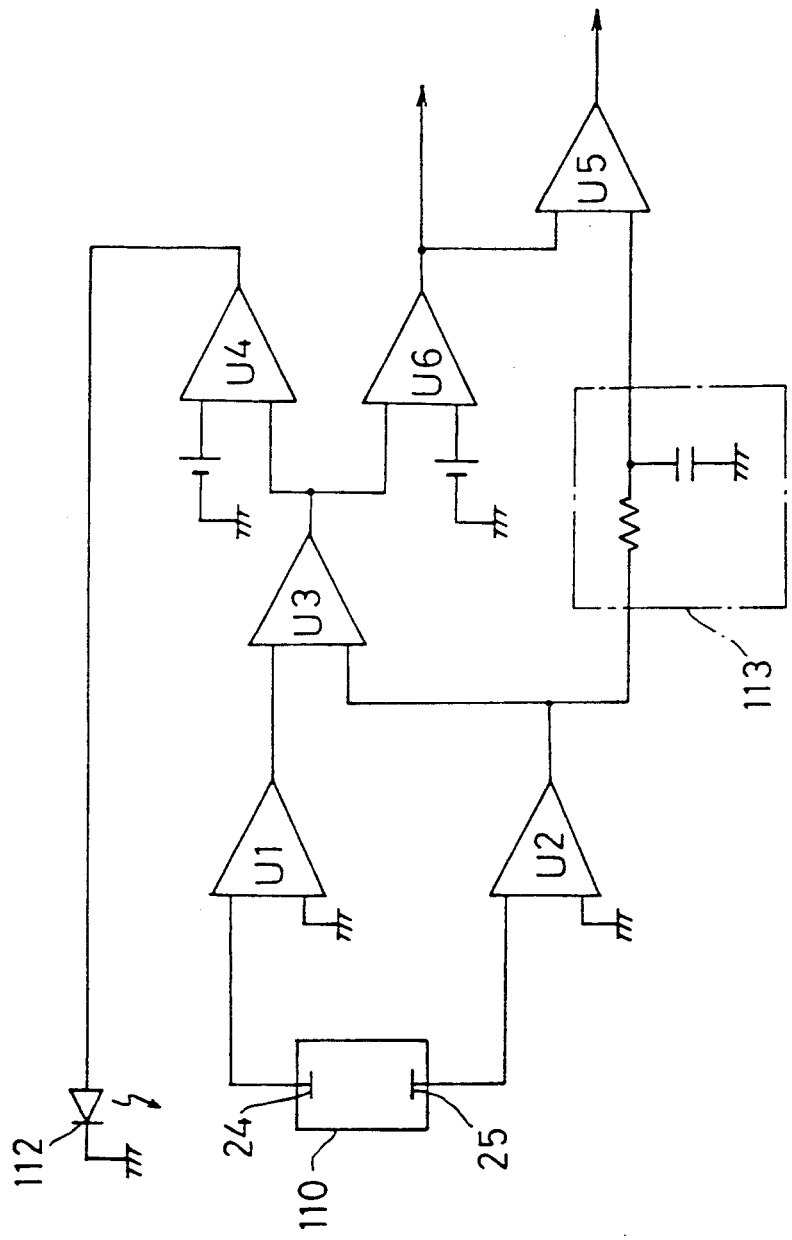
FIG. 14 is a circuit diagram of a picture image input device according to another embodiment of this invention.

FIG. 14 is a circuit diagram of the picture image input device according to another embodiment of this invention. Shown is a picture image input device employing the one-dimensional semiconductor light beam position sensor element.

The semiconductor light beam position sensor element 110 is provided with a pair of electrodes of opposed polarities 24, and the current values derived from the electrodes 24, 25 vary according to the position of incidence of the light beam from an LED 112. These currents are respectively amplified in current amplifiers U1 and U2 to give position signals. These position signals are summed in an adder-amplifier U3. For example, when an original including a dark line is placed on the position sensor element 110 and a light beam from the LED 112 is caused to trace the original, the output of the adder-amplifier U3 changes in pulses. This pulsating change in the output of the adder-amplifier U3 is detected as a bright-dark signal by a comparator U6. A sample hold circuit U5 samples the position signal from the current amplifier U2 with the bright-dark signal detected by the comparator U6, holds it and, then, outputs it as a bright-dark signal. The position signal sampling circuit is provided with a delay circuit 113 so that the position signal a little preceding the occurrence of a change in brigth-dark signal is sample as a dark area position signal. On the other hand, the change in the quantity of incident light is monitored using the output of said adder-amplifier U3 and feedback control is applied according to the output of said amplifier U3 so as to keep constant the quantity of light incident on the position sensor element 110. Thus, in a subtractor-amplifier U4, a subtraction operation is carried out between the output of adder-amplifier U3 and the set reference voltage and the value of current fed to LED 112 is corrected accoding to the result of subtracttion. The embodiment shown in FIG. 14 does not include an exclusive incident light quantity detection means but the variation in the quantity of incident light is monitored from the output of the adder-amplifier U3.

Figure 15:
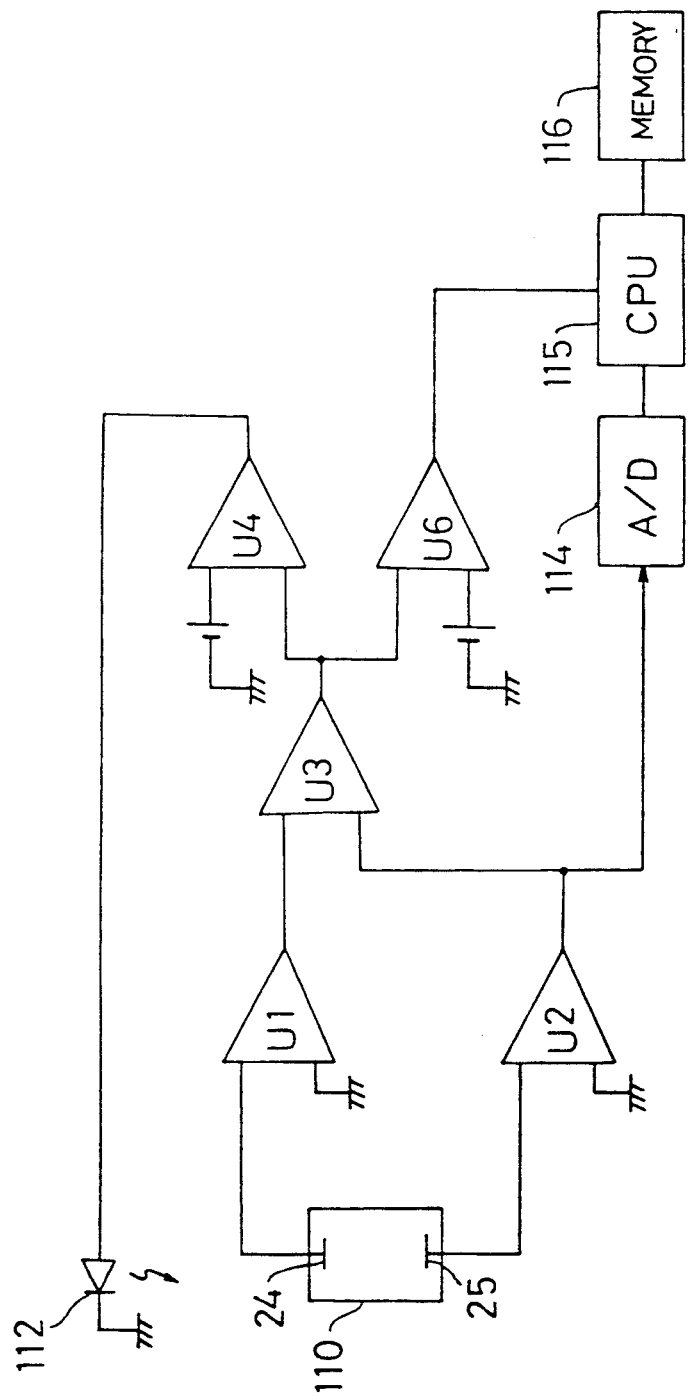
FIG. 15 is a circuit diagram of a picture image input device according to a still another embodiment of this invention.

FIG. 15 is a circuit diagram of the picture image input device according to a still another embodiment of this invention.

In the picture image input device shown in FIG. 15, the synthetic signal generating means is constituted by a computer. The position signal output of a current amplifier U2 is subjected to A/D conversion in an A/D convertor means 114 and, through a CPU 115, stored in a memory 116 as data per unit time. The variation in the bright-dark signal of comparator U6 is inputted into the CPU 115. The CPU 115 causes the memory 116 to store the position signals before and after the rise or fall of the bright-dark signal as position data.

Figure 16:
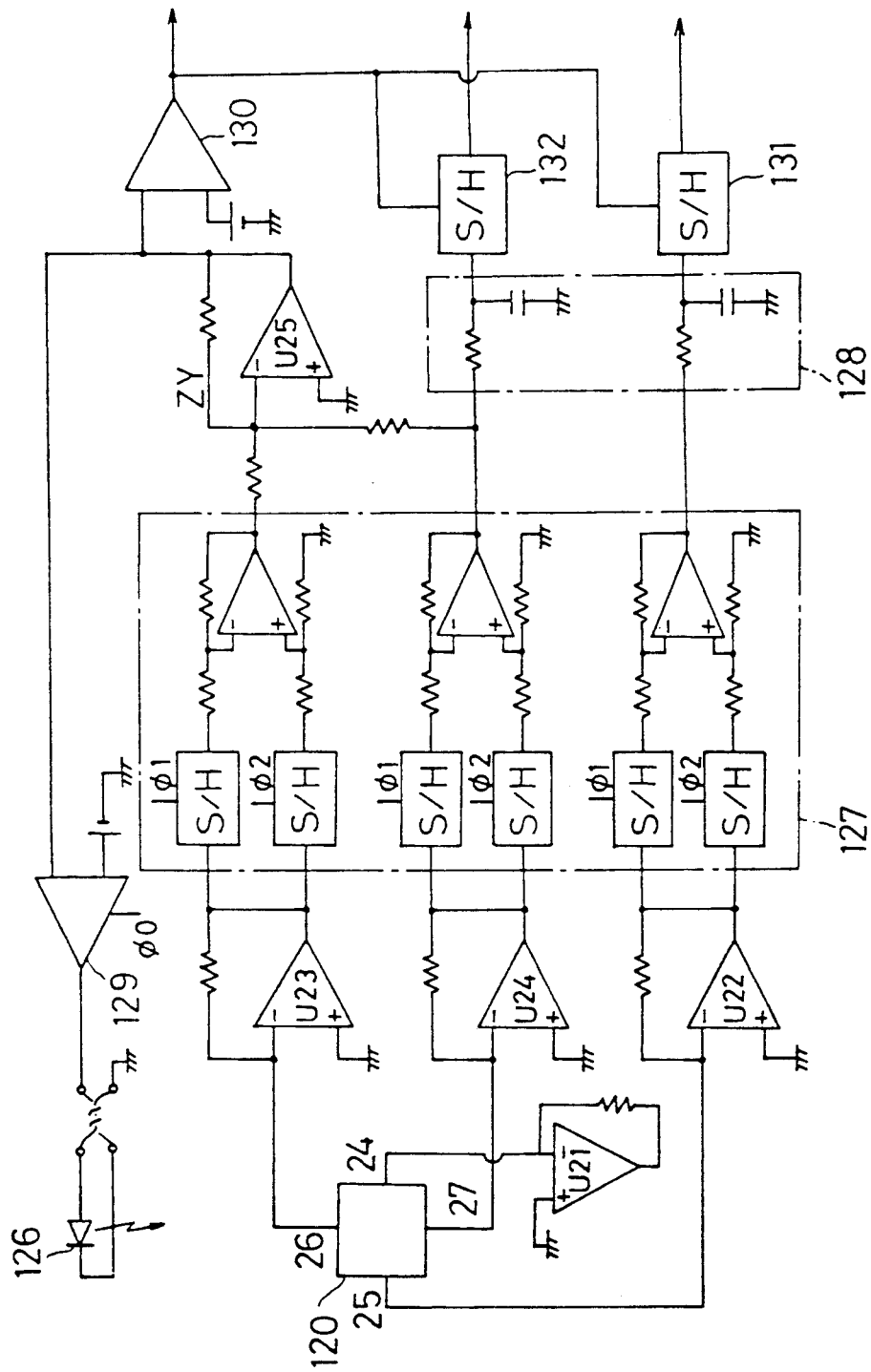
FIG. 16 is a circuit diagram of a picture image input device according to a further embodiment of this invention.

FIG. 16 is a circuit diagram of the two-dimensional picture image input device according to still another embodiment of this invention.

Figure 17:
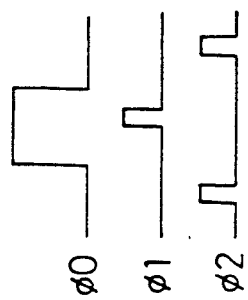
FIG. 17 is a diagrammatic representation of an example of the relationship between LED signal ($\phi_0$), bright-dark signal sampling ($\phi_1$) and noise sampling ($\phi_2$) in FIG. 16.

The currents derived from two pairs of electrodes 24, 25; 26 27 of a two-dimensional semiconductor light beam position sensor element 120 are respectively amplified in operational amplifiers U21, U22, U23 and U24 and freed of noise in a noise filter circuit 127. The sum of currents derived from one pair of electrodes 26, 27 is fed back to a subtractor-amplifier 129 for the purpose of maintaining the light emission of a LED 126 at a constant level. This embodiment does not include an exclusive incident light quantity detection means but, instead, the subtractor-amplifier 129 constitutes a means for maintaining the quantity of incident light at a constant level. The sum of currents derived from the pair of electrodes 26, 27 is passed through a comparator 130 to give a bright-dark signal. The output of electrode 25, as an X-direction position signal, and the output of electrode 27, as a Y-direction position signal, are both fed through a delay circuit 128 to sample-hold circuits 131, 132. According to a change in the bright-dark signal from the comparator 130, the position signals are held in the sample-hold circuit 131, 132. The position signals are position signals corresponding to the bright-dark signal. FIG. 17 is a diagrammatic representation showing the relationship of the LED signal ($\phi_0$), bright-dark signal sampling ($\phi_1$) and noise sampling ($\phi_2$). It should be understood that by means of the circuit shown, the variation in the quantity of incident light can be controlled within about 20 dB.

Though not shown, the X- and Y-direction position signals, i.e. the respective outputs of sample-hold circuits 131, 132, can be subjected to A/D conversion and fed to a computer so that the position corresponding to the time when the bright-dark signal from the comparator 130 has fallen low can be represented in white color on the display. Then, when a tracing paper having a pencil line drawing is placed on the semiconductor light beam position sensor element 120 and the light beam from the LED 126 is caused to trace the line drawing, the line is reproduced on the display. Thus, simple or rough sketch images can be inputted.

When the semiconductor light beam position sensor elements 101, 110 to be used in the above-described picture image input device are provided with the minute apertures described herein, light transmissivity can be imparted to the position sensor elements as described hereinbefore so that it is easy to change the irradiating position of the light beam. However, the semiconductor light beam position sensor not provided with such apertures may be used in the picture image input device. Morever, in any of the picture image input devices described, the quantity of light incident on the semiconductor light beam position sensor element is invariably controlled at a constant level by feedback control so that the position of incidence of the light beam can be determined from the output of one electrode of the electrode pair alone.

We claim:

1. A position sensor comprising a semiconductor light beam position sensor element including a semiconductor layer composed of p-, i- and n-type semiconductors successively formed and provided with electrodes on both sides, with at least the electrodes on one side forming an electrode pair, a light source which is variable in irradiating position with respect to said semiconductor light beam position sensor element and a means for detecting and holding constant the quantity of light incident on said semiconductor light beam sensor element.

2. A position sensor as claimed in claim 1 wherein said means for detecting and holding constant the quantity of light comprises an adder connected to output the sum of photoelectric current outputs derived from the respective electrodes of said electrode pair and a feedback circuit which, according to the output of said adder, acts on said light source to maintain the quantity of light incident on said semiconductor light beam position sensor element at a constant level.

3. A position sensor as claimed in claim 2, which further comprises a computor means connected to check whether the amount of operation of said feedback circuit is wihtin a predetermined range and thereby judging whether a light beam emitted from said light source is properly incident on said semiconductor light beam position sensor element.

4. A picture image input device comprising a semiconductor light beam position sensor element including a semiconductor layer compsied of p-, i- and n-type semiconductors successively formed and provided with electrodes on both sides, with at least electrodes on one side forming an electrode pair, a light source which is variable in irradiating position with respect to said semiconductor light beam position sensor element, a means for detecting and holding constant the quantity of light incident on said semiconductor light beam sensor element, a means for outputting a position signal representative of the point of incidence of said light beam on said semiconductor light beam position sensor element according to the photoelectric current derived from said electrode pair and a means for outputting a bright-dark signal representative of the intensity of the light beam incident on said semiconductor light beam sensor element after passing by an original according to the photoelectric current output derived from said electrode pair.

5. A picture image input device as claimed in claim 4 wherein said means for outputting a position signal comprises an amplifier connected to amplify the photoelectric current derived from one of the electrodes of said electrode pair.

6. A picture image input device as claimed in claim 4 wherein said means for outputting a bright-dark signal compises an adder connected to output the sum of photoelectric currents derived from respective electrodes of said electrode pair and a comparator connected to compare the output of said adder with a predetermined value.

7. A picture image input device as claimed in claim 4, which further comprises a delay circuit connected to delay said position signal and a sample-hold circuit connected to sample the output of said delay circuit with the variation timing of said bright-dark signal and holding the same.

8. A picture image input device as claimed in claim 4, which further comprises an A/D convertor means connected to convert said position signal to digital form, a memory means connected to store the output data per unit time form said A/D converter means, and a control means connected to designate a certain data, among said output data stored in said memory means, with the variation timing of said bright-dark signal as a picture image signal.

9. A picture image input device as claimed in claim 4, which further comprises a noise eliminating means connected to remove noise from the photoelectric currents derived from respective electrodes of said electrode pair.

10. A position sensor comprising a semiconductor light beam position sensor element including a semiconductor layer composed of successively formed p-, i- and n-type semiconductors and provided with electrodes on both sides, with at least the electrodes on one side forming an electrode pair, a light source which is variable in irradiating position with respect to said semiconductor light beam position sensor element, a means for detecting and holding constant the quantity of light incident on said semiconductor light beam sensor element, a means for outputting a position signal representative of the point of incidence of said light beam on said semiconductor light beam position sensor element according to the photoelectric current derived from said electrode pair and a means for outputting a bright-dark signal representative of the intensity of the light beam incident on said semiconductor light beam sensor element after being reflected by an original according to the photoelectric current output put derived from said electrode pair.

* * * * *

UNITED STATES PATENT AND TRADEMARK OFFICE
CERTIFICATE OF CORRECTION

PATENT NO. : 5,126,815
DATED : June 30, 1992
INVENTOR(S) : Satoru MURAKAMI et al It is certified that error appears in the above-identified patent and that said Letters Patent is hereby corrected as shown below:

ON THE TITLE PAGE:

Item [75], change the fourth inventor's last name from "Konda" to --Kondo--.

Signed and Sealed this

Tenth Day of August, 1993

Attest:

MICHAEL K. KIRK

*Attesting Officer*    Acting Commissioner of Patents and Trademarks